(12) United States Patent
Pei et al.

(10) Patent No.: US 9,053,956 B2
(45) Date of Patent: Jun. 9, 2015

(54) TRENCH CAPACITOR WITH SPACER-LESS FABRICATION PROCESS

(71) Applicant: International Business Machines Corporation, Armonk, NY (US)

(72) Inventors: Chengwen Pei, Danbury, CT (US); Xi Li, Somers, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 13/800,488

(22) Filed: Mar. 13, 2013

(65) Prior Publication Data
US 2013/0193563 A1 Aug. 1, 2013

Related U.S. Application Data

(62) Division of application No. 13/198,100, filed on Aug. 4, 2011, now Pat. No. 8,455,327.

(51) Int. Cl.
| | |
|---|---|
| *H01L 27/108* | (2006.01) |
| *H01L 29/76* | (2006.01) |
| *H01L 29/06* | (2006.01) |
| *H01L 21/308* | (2006.01) |
| *H01L 29/66* | (2006.01) |
| *H01L 29/94* | (2006.01) |
| *H01L 21/84* | (2006.01) |
| *H01L 27/12* | (2006.01) |

(52) U.S. Cl.
CPC ............ *H01L 29/0692* (2013.01); *H01L 21/84* (2013.01); *H01L 21/3081* (2013.01); *H01L 21/3086* (2013.01); *H01L 29/66181* (2013.01); *H01L 27/1087* (2013.01); *H01L 29/945* (2013.01); *H01L 27/1203* (2013.01)

(58) Field of Classification Search
CPC ............ H01L 29/66181; H01L 29/945; H01L 27/10829; H01L 27/10861; H01L 21/76264
USPC ................... 257/301, 305, 622; 438/386, 243
See application file for complete search history.

(56) References Cited

U.S. PATENT DOCUMENTS

| | | | |
|---|---|---|---|
| 6,566,273 B2 | 5/2003 | Kudelka | |
| 6,913,968 B2 | 7/2005 | Cheng et al. | |
| 7,713,814 B2 | 5/2010 | Cheng et al. | |
| 7,759,188 B2 * | 7/2010 | Cheng et al. | 438/243 |
| 2004/0082200 A1 | 4/2004 | Lin et al. | |
| 2005/0176198 A1 | 8/2005 | Kudelka | |
| 2009/0170331 A1 | 7/2009 | Cheng et al. | |
| 2009/0230508 A1 | 9/2009 | Dyer et al. | |
| 2009/0250738 A1 | 10/2009 | Dyer | |

OTHER PUBLICATIONS

Wang, G. et al.; A 0.127 μm2 High Performance 65nm SOI Based embedded DRAM for on-Processor Applications; Electron Devices Meeting 2006 IEDM '06 International; Dec. 11-13, 2006; pp. 1-4.

* cited by examiner

*Primary Examiner* — Theresa T Doan
(74) *Attorney, Agent, or Firm* — Joseph P. Abate; Howard H. Cohn (57) ABSTRACT

A trench capacitor and method of fabrication are disclosed. The SOI region is doped such that a selective isotropic etch used for trench widening does not cause appreciable pullback of the SOI region, and no spacers are needed in the upper portion of the trench.

6 Claims, 7 Drawing Sheets

TRENCH CAPACITOR WITH SPACER-LESS FABRICATION PROCESS

CROSS REFERENCE TO RELATED APPLICATIONS

This application is a division of commonly-owned, copending U.S. patent application Ser. No. 13/198,100 entitled TRENCH CAPACITOR WITH SPACER-LESS FABRICATION PROCESS and filed on Aug. 4, 2011.

FIELD OF THE INVENTION

The present invention relates generally to semiconductor fabrication, and more particularly, to trench capacitors, and methods of fabrication.

BACKGROUND OF THE INVENTION

A DRAM cell is essentially a capacitor for storing charge and a pass transistor (also called a pass gate or access transistor) for transferring charge to and from the capacitor. Data stored in the cell is determined by the absence or presence of charge on the storage capacitor. Because cell size affects chip density, and cost, reducing cell area is one of the DRAM designer's primary goals.

One way to accomplish this density goal without sacrificing storage capacitance is to use trench capacitors in the cells. Trench capacitors can be formed by etching deep trenches in a silicon wafer and forming vertically oriented capacitors within each deep trench. Thus, the surface area required for the storage capacitor is dramatically reduced without sacrificing capacitance, and correspondingly, storable charge.

Trench-type memory devices are advantageous, in comparison to planar memory configurations, for increased density, performance and lithographic considerations. Trench-type memory devices increase density by reducing the cell area of each memory device, therefore allowing for closer positioning of adjacent memory devices.

As the trend towards miniaturization increases, so does the performance demands of electronic devices, it is desirable to have an improved DRAM and method of fabrication.

SUMMARY

In one embodiment, a method for fabricating a trench in a semiconductor structure is provided. The semiconductor structure comprises a substrate and a layer stack, with the layer stack comprising a silicon-on-insulator layer. The method comprises performing a first anisotropic etch into the semiconductor structure, wherein the first anisotropic etch traverses the layer stack and penetrates the substrate, thereby forming an upper trench portion, performing an angular implant in the upper trench portion, thereby implanting a trench contact region of the silicon-on-insulator layer, performing a second anisotropic etch into the semiconductor structure, extending the upper trench portion further into the substrate, thereby forming a lower trench portion, and performing a selective isotropic etch, thereby widening the lower trench portion.

In another embodiment, a method for fabricating a trench in a semiconductor structure is provided. The semiconductor structure comprises a substrate and a layer stack, with the layer stack comprising a silicon-on-insulator layer. The method comprises performing a first anisotropic etch into the semiconductor structure, wherein the first anisotropic etch traverses the silicon-on-insulator layer, and partially traverses the BOX layer, thereby forming an upper trench portion, performing an implant in the upper trench portion, thereby implanting a trench contact region of the silicon-on-insulator layer, performing a second anisotropic etch into the semiconductor structure, completely traversing the BOX layer, and extending the upper trench portion into the substrate, performing a third anisotropic etch into the semiconductor structure, extending the upper trench portion further into the substrate, thereby forming a lower trench portion, and performing a selective isotropic etch, thereby widening the lower trench portion.

In another embodiment, a semiconductor structure is provided. The structure comprises a substrate, an insulator layer disposed on the substrate, a silicon-on-insulator layer disposed on the insulator layer, a trench formed in the substrate, wherein an upper portion of the trench traverses the insulator layer and silicon-on-insulator layer, and a lower portion of the trench is formed within the substrate, and wherein the upper portion has a first width and the lower portion has a second width, and wherein the second width is greater than the first width.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

DETAILED DESCRIPTION

Figure 1:
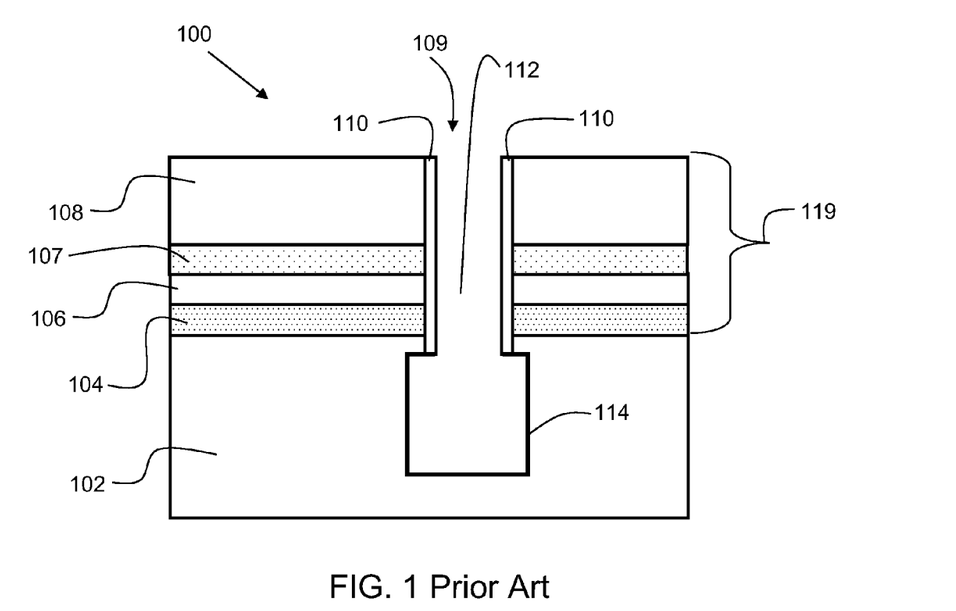
FIG. 1 shows a prior art trench capacitor.

To provide context for the detailed description, a prior art semiconductor structure 100 shown in FIG. 1 is briefly described below. A silicon substrate 102 has an insulator layer comprised of buried oxide (BOX layer) 104 disposed on the substrate 102. Above the BOX layer 104 is a silicon-on-insulator (SOI) layer 106. Above the SOI layer is a nitride cap layer 107. Above the nitride cap layer 107 is a hard mask layer 108. The hard mask layer 108, nitride cap layer 107, SOI layer 106, and BOX layer 104 comprise a layer stack 119 that is disposed on top of substrate 102.

A trench 109 is formed within the semiconductor structure. The trench 109 comprises an upper trench portion 112, and a lower trench portion 114. The lower trench portion 114 is wider than the upper trench portion 112. Nitride spacer 110 lines the upper portion 112 of trench 109. This reduces the critical dimension (width of the upper trench portion) which complicates anisotropic etching, such as is performed with a reactive ion etch (RIE) technique. The existing spacer 110 complicates the process of making a deeper trench with a similar aspect ratio. The presence of spacer 110 also makes the effective size of the trench opening smaller during implantation process used to form a buried plate. Fabrication of a buried plate depends on a certain level of implanted dopants through the top DT (deep trench) opening after DT RIE (reactive ion etch) to form the common bottom electrode, i.e. buried plate for a DRAM. It is therefore desirable to fabricate a trench capacitor without such a spacer. However, the spacer 110 performs an important function of protecting the SOI layer 106 during subsequent etching. Embodiments of the present invention provide for a trench capacitor and method of fabrication that eliminates the spacer without compromising the SOI layer 106.

Figure 2:
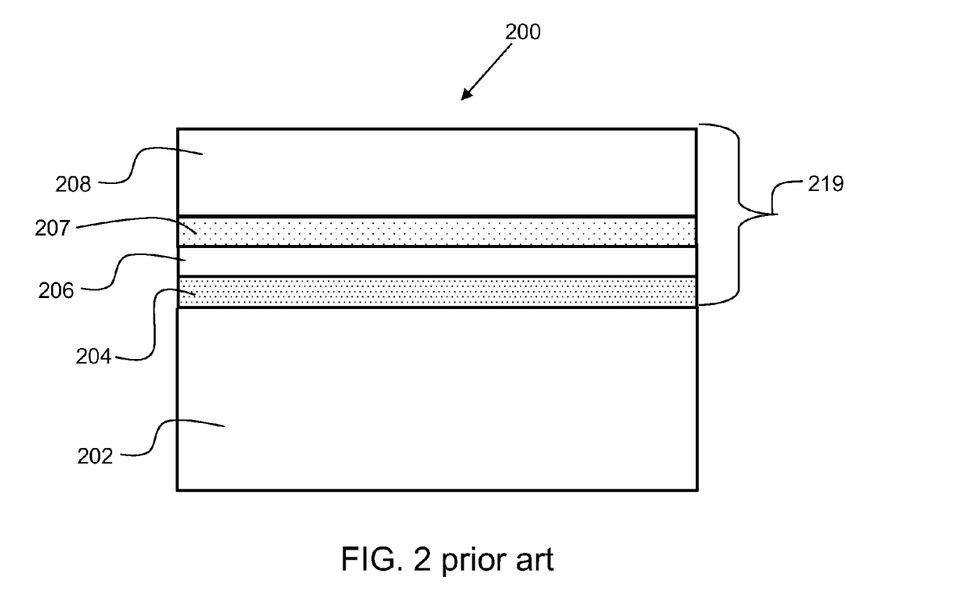
FIG. 2 shows a semiconductor structure at a starting point for fabrication of a trench capacitor in accordance with an embodiment of the present invention.

FIG. 2 shows a semiconductor structure 200 at a starting point for fabrication of a trench capacitor in accordance with an embodiment of the present invention. As stated previously, often, similar elements may be referred to by similar numbers in various figures (FIGs) of the drawing, in which case typically the last two significant digits may be the same, the most significant digit being the number of the drawing figure (FIG). Hence, silicon substrate 202 of FIG. 2 is similar to silicon substrate 102 of FIG. 1, and BOX layer 204 of FIG. 2 is similar to BOX layer 104 of FIG. 1, for example.

Figure 3:
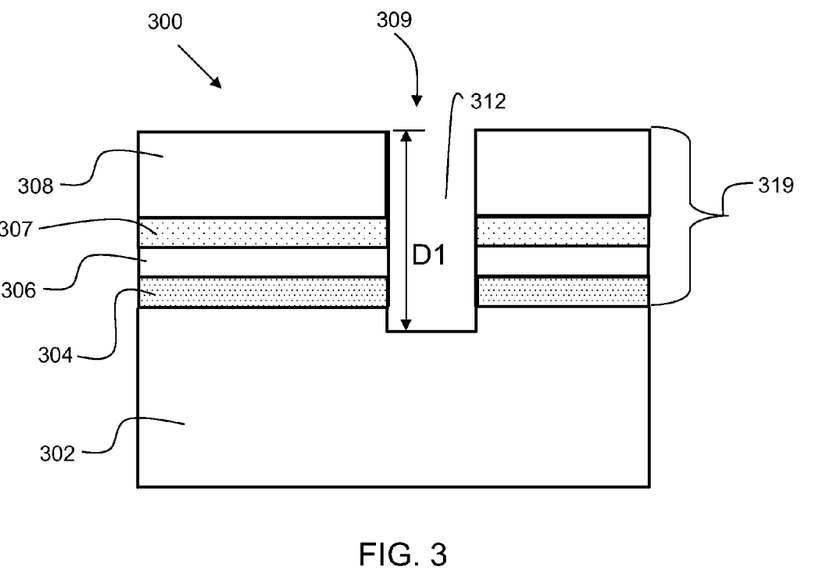
FIG. 3 shows a subsequent step in the fabrication process, after performing a first anisotropic etch.

FIG. 3 shows a semiconductor structure 300 after a subsequent step in the fabrication process, after performing a first anisotropic etch. The upper portion 312 of trench 309 is formed by performing an anisotropic etch to a depth D1, such that upper portion 312 traverses the layer stack 319, penetrating through BOX layer 304 and into substrate 302. In one embodiment, BOX layer 304 has a thickness in the range of 40 nanometers to 160 nanometers.

Figure 4:
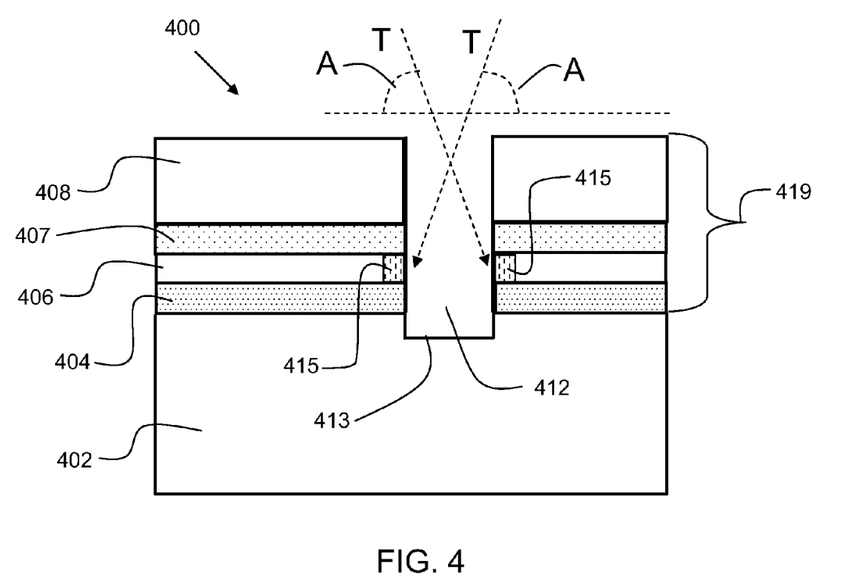
FIG. 4 shows a subsequent step in the fabrication process of performing an angular upper trench implant.

FIG. 4 shows a semiconductor structure 400 after a subsequent step in the fabrication process of performing an angular upper trench implant. The angular implanting, represented by lines "T" are at angle "A" from horizontal. In one embodiment, angle A is in the range of 15 to 60 degrees. The angled implant provides dopants to trench contact region 415 of SOI layer 406. However, the angled implant does not reach the base 413 of the upper portion 412 of the trench. Hence, substrate 402 does not receive dopants from the angled implant. The dopant is opposite to the type of substrate 402. For example, if substrate 402 is comprised of N-type silicon, then the dopant used for the angular implanting is comprised of a P-type dopant, such as boron. Similarly, if substrate 402 is comprised of P-type silicon, then the dopant used for the angular implanting is comprised of an N-type dopant, such as arsenic or phosphorus. In one embodiment, the dopant concentration ranges from about 1E-19 to about 1E-17 atoms/cm3. In one embodiment, SOI layer 406 has a thickness in the range of 30 nanometers to 110 nanometers.

Figure 5:
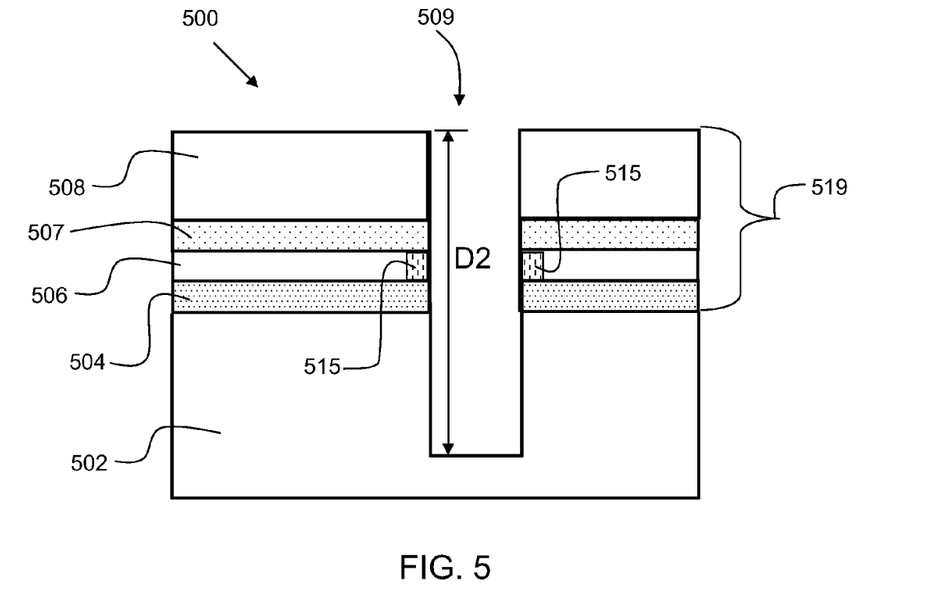
FIG. 5 shows a subsequent step in the fabrication process, after performing a second anisotropic etch.

FIG. 5 shows a semiconductor structure 500 after a subsequent step in the fabrication process, after performing a second anisotropic etch, extending trench 509 to a depth D2.

Figure 6:
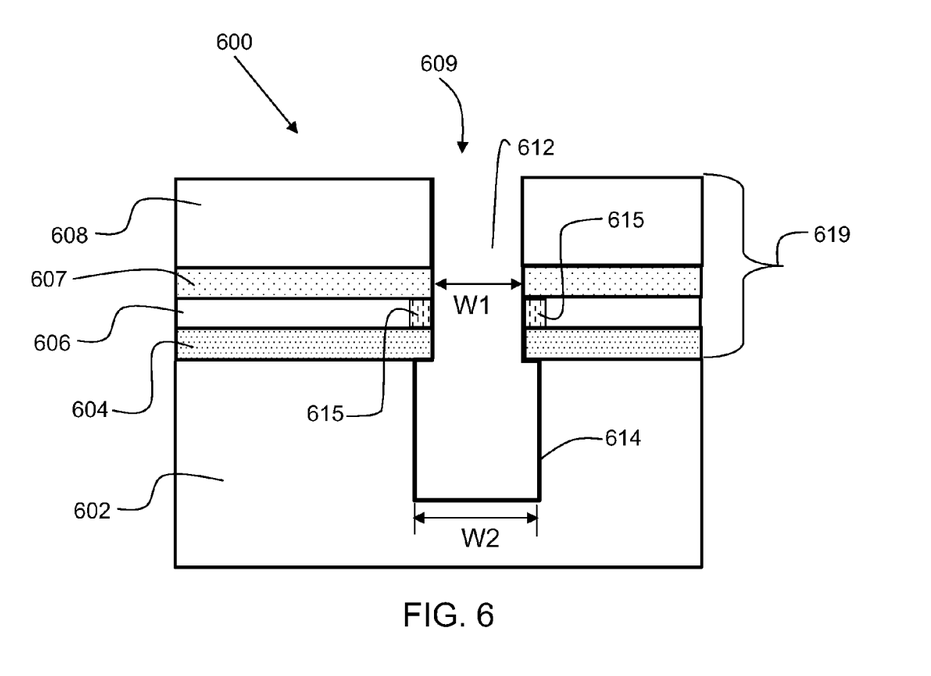
FIG. 6 shows a subsequent step in the fabrication process, after performing a selective isotropic etch.

FIG. 6 shows a semiconductor structure 600 after a subsequent step in the fabrication process, after performing a selective isotropic etch. The selective isotropic etch may be a wet etch. The selective isotropic etch widens the lower portion 614 of trench 609 to a width W2, which is greater than width W1 of the upper portion 612 of trench 609. The larger width W2 provides additional surface area, which in turn allows for increased capacitance. In one embodiment, width W1 ranges from 40 nanometers to 120 nanometers, and width W2 ranges from 90 nanometers to 180 nanometers.

The selective isotropic etch does not significantly etch the SOI layer 606 because of the dopants in trench contact region 615. In one embodiment, a selective wet etch is used, and the etchant used for the selective wet etch is HF. In one embodiment, a highly selective KOH-based etchant is used for a boron-doped SOI layer.

Figure 7:
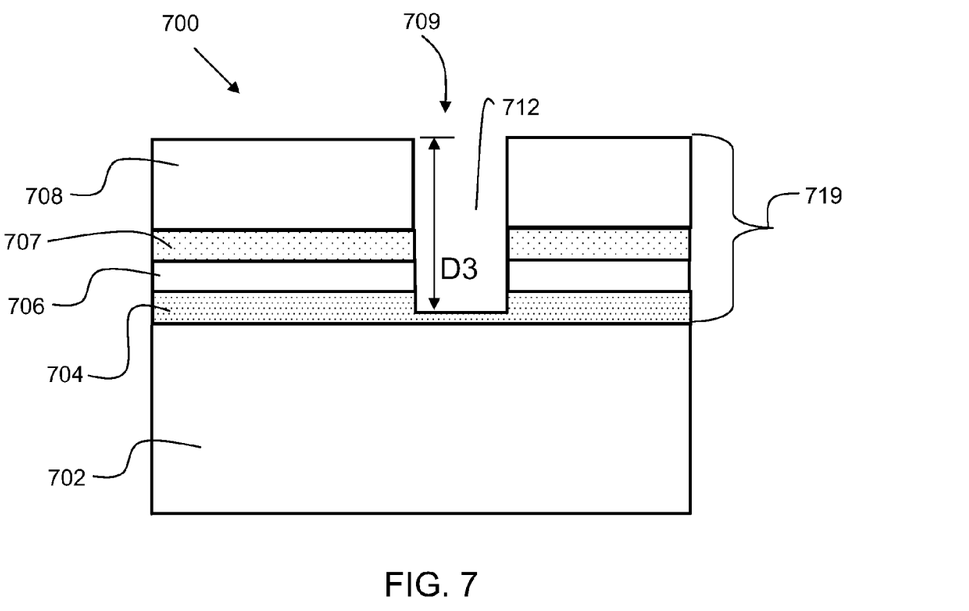
FIG. 7 shows an alternative embodiment of a subsequent step in the fabrication process, following from FIG. 2, after performing a first anisotropic etch.

FIG. 7 shows a semiconductor structure 700 of an alternative embodiment, after a subsequent step in the fabrication process, following from FIG. 2, after performing a first anisotropic etch. The upper portion 712 of trench 709 is formed by performing an anisotropic etch to a depth D3, such that upper portion 712 does not completely traverse layer stack 719, and instead, stops part way through BOX layer 704, only partially traversing BOX layer 704, and does not penetrate into substrate 702 (compare with 312 of FIG. 3).

Figure 8:
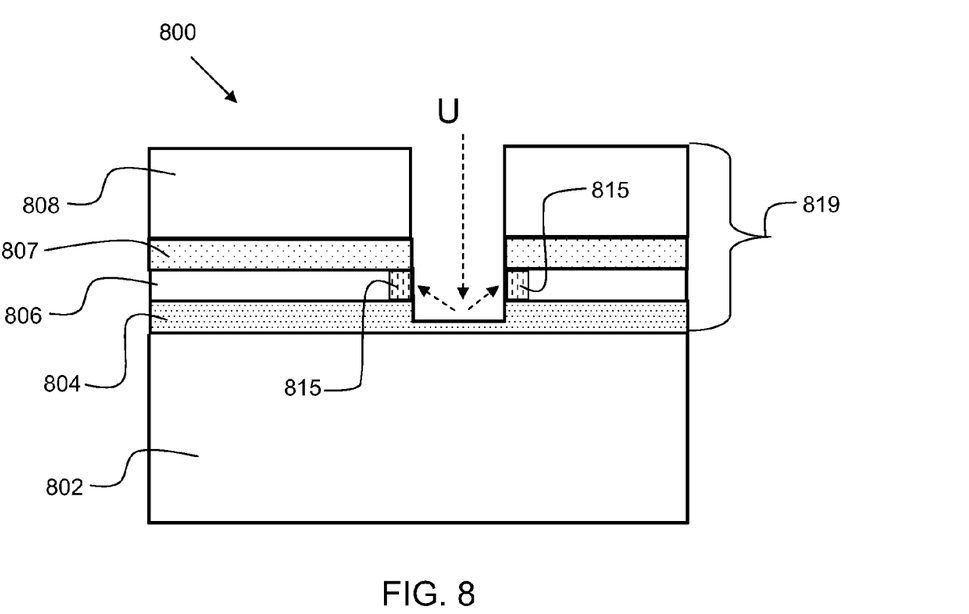
FIG. 8 shows a subsequent step in the fabrication process, following from FIG. 7, of performing an upper trench implant.

FIG. 8 shows a semiconductor structure 800 after a subsequent step in the fabrication process, following from FIG. 7, of performing an upper trench implant. The upper trench implant, represented by lines U, may be a vertical implant. Scattering of dopants that occurs during this process implants dopants into trench contact region 815 of SOI layer 806. Because the substrate 802 is not exposed, the dopants do not reach into the substrate 802, and hence, the angled implant described in FIG. 4 is not essential here.

Figure 9:
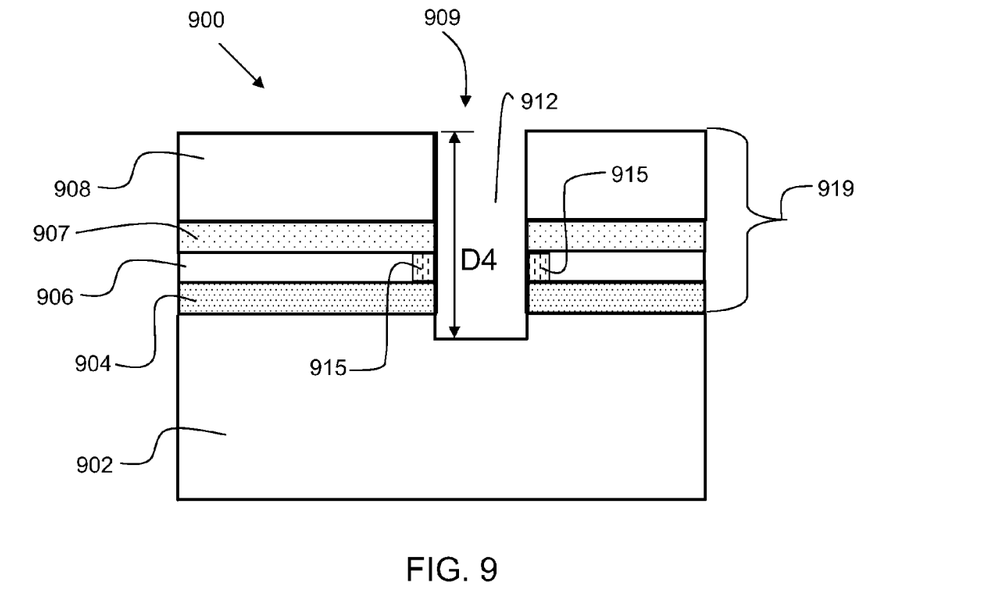
FIG. 9 shows a subsequent step in the fabrication process, following from FIG. 8, after performing a second anisotropic etch.

FIG. 9 shows a semiconductor structure 900 after a subsequent step in the fabrication process, following from FIG. 8, after performing a second anisotropic etch. The trench 909 is now extended to a depth D4, and now traverses layer stack 919, penetrating the BOX layer 904 and extending into substrate 902. From this point forward, the selective isotropic etch technique shown in FIG. 6 is used to achieve the widened lower portion of the trench capacitor (see 614 of FIG. 6).

Figure 10:
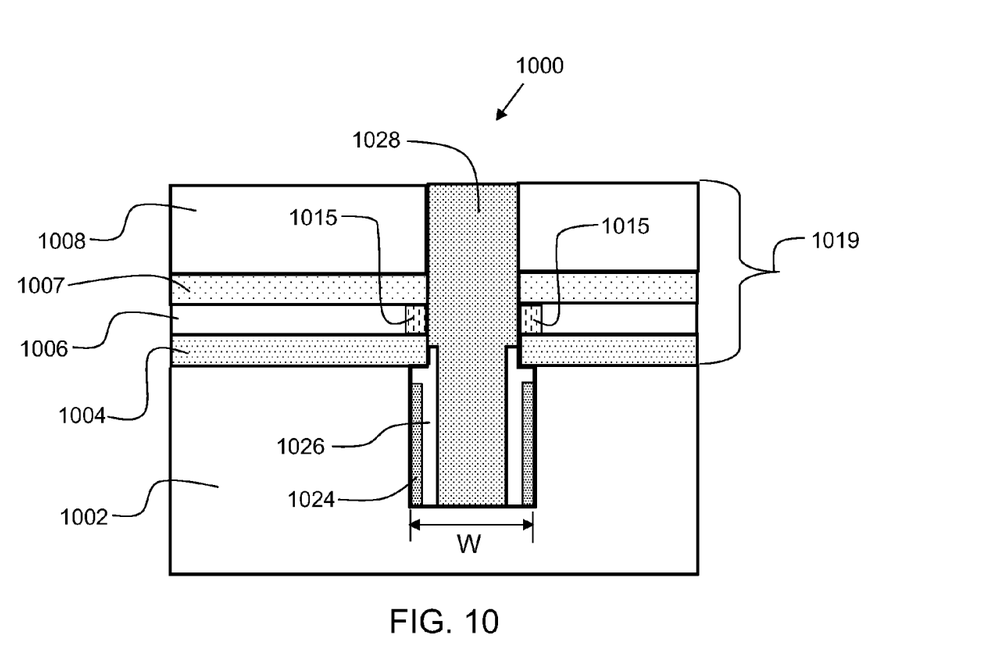
FIG. 10 shows a trench capacitor in accordance with an embodiment of the present invention.

FIG. 10 shows a trench capacitor in accordance with an embodiment of the present invention. Proceeding forward from structure 600 shown in FIG. 6, standard fabrication techniques are used to complete the trench capacitor. The resulting trench capacitor 1000 does not have any spacers (compare with spacers 110 of FIG. 1). Trench contact region 1015 is part of SOI layer 1006, and forms part of the trench wall. Trench contact region 1015 is substantially flush with the other layers (1004, 1007, 1008) along the trench. Hence, there is negligible "pull back" of the SOI layer 1006, and the spacer, and its disadvantages are avoided.

A metal plate 1024, dielectric layer 1026, and conductive plug 1028 are deposited within the trench (609 of FIG. 6) to form a functional trench capacitor. In one embodiment, the outer electrode plate is comprised of heavily doped silicon or a silicide based on TiN, tungsten, copper, cobalt, or nickel. The dielectric layer 1026 may be comprised of hafnium oxide. The conductive plug may be comprised of a metal, such as TiN, tungsten or copper, or may be comprised of polysilicon.

Figure 11:
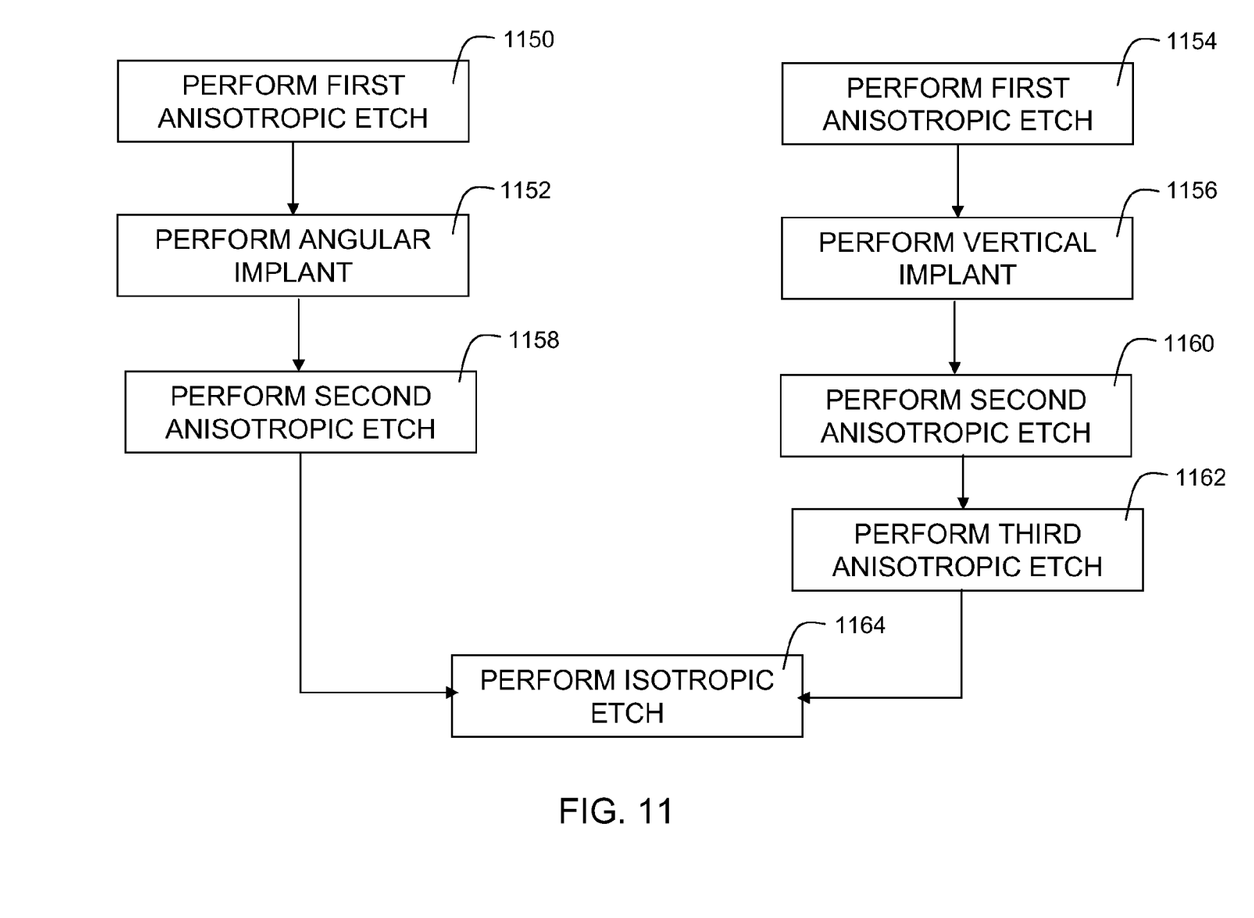
FIG. 11 is a flowchart indicating process steps for an embodiment of the present invention.

FIG. 11 is a flowchart indicating process steps for embodiments of the present invention. One embodiment starts with process step 1150, which comprises performing a first anisotropic etch. This etch penetrates the BOX layer and extends into the substrate (see FIG. 3). The process then proceeds to process step 1152, where an angular implant is performed. This implants the trench contact region (region of the SOI that is along the trench wall, see FIG. 4). The process then proceeds to process step 1158, where a second anisotropic etch is performed, to create the lower trench portion (See FIG. 5). Then, in process step 1164, a selective isotropic etch is performed to widen the lower portion of the trench (See FIG. 6).

An alternative embodiment is indicated in FIG. 11 with the following process steps. In process step 1154, a first anisotropic etch is performed. In this embodiment, the first anisotropic etch stops part way through the BOX layer (see FIG. 7). In process step 1156, a vertical implant is performed. Since the BOX layer is not completely penetrated, the underlying substrate is not implanted (see FIG. 8). In process step 1160, a second anisotropic etch is performed to completely penetrate the BOX layer (see FIG. 9). In process step 1162, a third anisotropic etch is performed to etch the substrate to form the lower trench. The resulting semiconductor structure is similar to that for step 1158 (see FIG. 5). Next, the process proceeds to step 1164 described previously, to form the widened lower trench portion (see FIG. 6).

Figure 12:
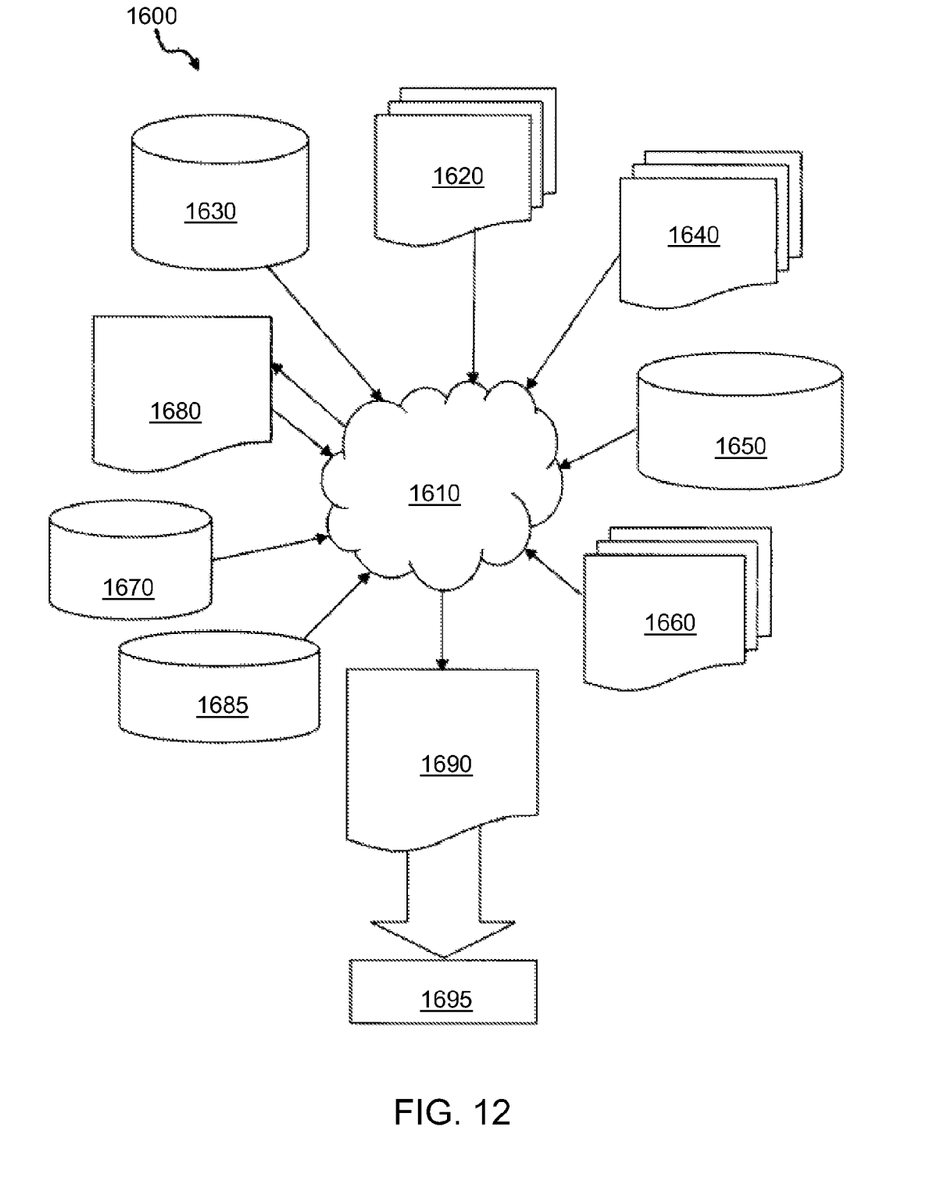
FIG. 12 shows a block diagram of an exemplary design flow.

FIG. 12 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 3-11. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 3-11. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 3-11 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 3-11, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 3-11. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
   a substrate;
   an insulator layer disposed on the substrate;
   a silicon-on-insulator layer disposed on the insulator layer;
   a trench formed in the substrate, wherein an upper portion of the trench traverses the insulator layer and silicon-on-insulator layer, and a lower portion of the trench is formed within the substrate, and wherein the upper portion has a first width and the lower portion has a second width, and wherein the second width is greater than the first width; and
   wherein the silicon-on-insulator layer comprises a trench contact region that forms a portion of an interior surface of upper portion of the trench, and wherein a conductive plug is disposed in the trench and wherein the conductive plug is in direct physical contact with the trench contact region of the silicon-on-insulator layer.

2. The semiconductor structure of claim 1, wherein the silicon-on-insulator layer is flush with the insulator layer.

3. The semiconductor structure of claim 2, wherein the trench contact region has a dopant concentration in the range of about 1E-19 atoms/cm3 to about 1E-17 atoms/cm3.

4. The semiconductor structure of claim 2, wherein the insulator layer comprises a buried oxide layer.

5. The semiconductor structure of claim 4, wherein the silicon-on-insulator layer has a thickness ranging from about 35 nanometers to about 100 nanometers.

6. The semiconductor structure of claim 5, wherein the buried oxide layer has a thickness ranging from about 50 nanometers to about 150 nanometers.

* * * * *